US012108805B2

(12) United States Patent
Qiu et al.

(10) Patent No.: US 12,108,805 B2
(45) Date of Patent: Oct. 8, 2024

(54) POSITION DETECTION CIRCUIT AND ELECTRONIC CIGARETTE

(71) Applicant: CHANGZHOU PATENT ELECTRONIC TECHNOLOGY CO., LTD, Changzhou (CN)

(72) Inventors: Weihua Qiu, Jiangsu (CN); Yuhui Zhang, Jiangsu (CN)

(73) Assignee: CHANGZHOU PATENT ELECTRONIC TECHNOLOGY CO., LTD, Changzhou (CN)

( * ) Notice: Subject to any disclaimer, the term of this patent is extended or adjusted under 35 U.S.C. 154(b) by 464 days.

(21) Appl. No.: 17/488,347

(22) Filed: Sep. 29, 2021

(65) Prior Publication Data

US 2022/0015445 A1    Jan. 20, 2022

Related U.S. Application Data

(63) Continuation-in-part of application No. PCT/CN2020/081105, filed on Mar. 25, 2020.

(30) Foreign Application Priority Data

Mar. 29, 2019   (CN) .......................... 201910252416.5

(51) Int. Cl.
*A24F 40/53* (2020.01)
*A24F 40/42* (2020.01)
(Continued)

(52) U.S. Cl.
CPC .............. *A24F 40/53* (2020.01); *A24F 40/42* (2020.01); *A24F 40/46* (2020.01); *A24F 40/57* (2020.01);
(Continued)

(58) Field of Classification Search
CPC .......... A24F 40/51; A24F 40/50; A24F 40/53; A24F 40/40
See application file for complete search history.

(56) References Cited

U.S. PATENT DOCUMENTS 11,903,425 B2 * 2/2024 Leadley ................. A24F 40/50
11,904,134 B2 * 2/2024 Gray ................. A61B 5/150358
(Continued)

FOREIGN PATENT DOCUMENTS

CN    103698640 A    4/2014
CN    108402525 A    8/2018
(Continued)

OTHER PUBLICATIONS

The extended European search report of EP application No. 20782939.1 issued on Nov. 23, 2022.

*Primary Examiner* — Truc T Nguyen
(74) *Attorney, Agent, or Firm* — Andrew C. Cheng (57) ABSTRACT

The application provides a position detection circuit, which is connected to a processing circuit (200), and includes a first switch module (110) and a first ground resistor (R1); the first switch module (110) includes a first end, a second end and a first switch (T1), the first switch module (110) is used for controlling on/off state of the first switch (T1) according to whether the placement member is placed at a first placement position, the first end of the first switch module (110) receives a system voltage (Vcc), and the second end outputs a first state signal or a second state signal to the processing circuit (200) according to the on/off state of the first switch (T1); and the first grounding resistor (R1) has a first end connected to the second end of the first switch module (110), and a second end grounded. Also provided is an electronic cigarette.

19 Claims, 3 Drawing Sheets

(51) Int. Cl.
  *A24F 40/46*  (2020.01)
  *A24F 40/57*  (2020.01)
  *A24F 40/85*  (2020.01)
  *G01D 5/14*  (2006.01)
  *G01D 5/40*  (2006.01)

(52) U.S. Cl.
  CPC ............ *A24F 40/85* (2020.01); *G01D 5/145* (2013.01); *G01D 5/40* (2013.01)

(56) References Cited

U.S. PATENT DOCUMENTS

| | | |
|---|---|---|
| 2015/0173124 A1 | 6/2015 | Qiu |
| 2016/0192712 A1* | 7/2016 | Memari ................. G01F 23/00 141/2 |
| 2017/0043999 A1* | 2/2017 | Murison ............... B67D 7/145 |
| 2019/0167922 A1* | 6/2019 | Cole ...................... A24F 40/48 |
| 2019/0289908 A1* | 9/2019 | Worm ................... A61M 11/042 |
| 2024/0057670 A1* | 2/2024 | Aoyama ................ A24F 40/46 |
| 2024/0058939 A1* | 2/2024 | Stalfors .................... B25F 5/00 |

FOREIGN PATENT DOCUMENTS

| | | | | |
|---|---|---|---|---|
| DE | 4115307 A | 11/1992 | | |
| EP | 3552643 A1 | 10/2019 | | |
| WO | 2016074363 A | 5/2016 | | |
| WO | WO 2018216961 | * 11/2018 | ............. | A24F 40/51 |

* cited by examiner

POSITION DETECTION CIRCUIT AND ELECTRONIC CIGARETTE

CROSS-REFERENCE TO RELATED APPLICATIONS

This application is a continuation-in-part of International Patent Application No. PCT/CN2020/081105, filed on Mar. 25, 2020, entitled "position detection circuit and electronic cigarette", which claims priority to Chinese Patent Application No. CN201910252416.5, filed on Mar. 29, 2019. All of the aforementioned patent applications are hereby incorporated by reference in their entireties.

TECHNICAL FIELD

The disclosure relates to the technical field of electronic control technology, and more particularly, relates to a position detection circuit and an electronic cigarette.

BACKGROUND

In order to provide users with more experience, the existing electronic cigarettes not only realize the smoking function, but also come with many functions. Such as multimedia browsing, touch screen operation, GPS navigation, solar charging and other functions, the intention is for manufacturers to better promote their electronic cigarette products.

However, there may be situations in which the electronic cigarette main body can still work when the placement position of the cartridge of the electronic cigarette is incorrect. This may cause a waste of energy, and may also bring certain safety hazards, thereby preventing users from getting a better experience.

SUMMARY

Based on the above, it is necessary to provide a position detection circuit and an electronic cigarette, which can solve the problem that the electronic cigarette main body still works when the position of the cartridge of the electronic cigarette is incorrect.

The technical solutions adopted by the present disclosure to solve the technical problems are as follows:

The disclosure provides a position detection circuit having a first switch module outputting a first state signal, a position detection circuit, which is connected to the processing circuit (200) for detecting whether the placement member is correctly placed, the position detection circuit includes:

the first switch module (110), including a first end, a second end and a first switch (T1), the first switch module (110) configured to control the on-off state of the first switch (T1) according to whether the placement member is placed in the first placement position, the first end of the first switch module (110) receives the system voltage (Vcc), the second end of the first switch module (110) outputting the first state signal to the processing circuit 200 according to the on-off state of the first switch (T1); and a first ground resistor (R1), including a first ground resistor end and a second ground resistor end, the first ground resistor end of the first ground resistor (R1) is connected to the second end of the first switch module (110), and the second ground resistor end of the first ground resistor (R1) is grounded.

In one embodiment, the first switch (T1) comprises a first switch end and a second switch end; and the first switch end of the first switch (T1) acts as the first end of the first switch module (110); the second switch end of the first switch (T1) acts as the second end of the first switch module (110).

In one embodiment, the position detection circuit also includes a second ground resistor (R2) which includes a third ground resistor end and a fourth ground resistor end, the third ground resistor end of the second ground resistor (R2) is connected to the first ground resistor end of the first ground resistor (R1), the fourth ground resistor end of the second ground resistor (R2) is connected to the second ground resistor end of the first ground resistor (R1).

In one embodiment, a first connection resistor (RL1) is further provided between the second end of the first switch module (110) and the processing circuit (200), a first connection resistor end of the first connection resistor (RL1) is connected to the processing circuit (200), a second connection resistor end of the first connection resistor (RL1) is connected to the second end of the first switch module (110).

In one embodiment, the position detection circuit further includes:

the second switch module (120), the second switch module (120) including a third end, a fourth end and a second switch (T2), the second switch module (120) configured to control on-off state of the second switch (T2) according to whether the placement member is placed in the first placement position, the third end of the second switch module (120) receiving the system voltage (Vcc), the fourth end of the second switch module (120) connected to the processing circuit (200) and outputting a third state signal or a fourth state signal to the processing circuit (200) according to the on-off state of the second switch (T2); and a third ground resistor (R3) including a fifth ground resistor end and a sixth ground resistor end, the fifth ground resistor end of the third ground resistor (R3) connected to the fourth end of the second switch module (120), the sixth ground resistor end of the third ground resistor (R3) grounded.

In one embodiment, the position detection circuit further includes:

a third switch module (130), the third switch module (130) including a fifth end, a sixth end and a third switch (T3), the third switch module (130) configured to control on-off state of the third switch (T3) according to whether the placement member is placed in the second placement position, the fifth end of the third switch module (130) receiving the system voltage (Vcc), the sixth end of the third switch module (130) connected to the processing circuit (200) and outputting a fifth state signal or a sixth state signal to the processing circuit (200) according to the on-off state of the third switch (T3); and a fifth ground resistor (R5) including a seventh ground resistor end and an eighth ground resistor end, the seventh ground resistor end of the fifth ground resistor (R5) connected to the sixth end of the third switch module (130), the eighth ground resistor end of the fifth ground resistor (R5) is grounded.

The disclosure provides an electronic cigarette having a first switch module outputting a first state signal, the electronic cigarette includes an electronic cigarette main body and a cartridge. The cartridge is detachably matched with the electronic cigarette main body, the electronic cigarette main body includes the processing circuit (200) and the position detection circuit according to the above-mentioned. The placement member is the cartridge of the electronic cigarette. An aerosol-forming matrix is stored in the cartridge.

In one embodiment, the electronic cigarette main body further includes a heating member, the processing circuit (200) detects that the placement member is not placed correctly according to the position detection circuit, the processing circuit (200) controls the heating member not to work.

In one embodiment, the electronic cigarette main body further includes a heating member, when the processing circuit (200) receives the cigarette lighter signal, and the processing circuit (200) detects that the placement member is correctly placed according to the position detection circuit, the processing circuit (200) controls the heating member to work.

In one embodiment, the electronic cigarette main body further includes a heating member, when the processing circuit (200) detects according to the position detection circuit that the placement member changes from being placed correctly to being incorrectly placed, the processing circuit (200) controls the heating member to clean the residue attached to the heating member.

The disclosure provides a position detection circuit, the position detection circuit is connected to the processing circuit for detecting whether the placement member is correctly placed, the position detection circuit includes a first switch module and a first ground resistor; the first switch module includes a first end, a second end and a first switch, the first switch module is configured to control the on-off state of the first switch according to whether the placement member is placed in the first placement position; the first end of the first switch module receives the system voltage, the second end of the first switch module is connected to the processing circuit and outputs a first state signal to the processing circuit according to the on-off state of the first switch; a first ground resistor including a first ground resistor end and a second ground resistor end, the first ground resistor end of the first ground resistor is connected to the second end of the first switch module, the second ground resistor end of the first ground resistor is grounded.

The first state signal is to detect whether the placement member is placed in a preset position.

In one of the embodiments, the first switch includes a first switch end and a second switch end, the first switch end of the first switch acts as the first end of the first switch module; the second switch end of the first switch acts as the second end of the first switch module.

In one of the embodiments, the position detection circuit further includes a second ground resistor which includes a third ground resistor end and a fourth ground resistor end, the third ground resistor end of the second ground resistor is connected to the first ground resistor end of the first ground resistor, the fourth ground resistor end of the second ground resistor is connected to the second ground resistor end of the first ground resistor.

In one of the embodiments, a first connection resistor is further provided between the second end of the first switch module and the processing circuit, the first connection resistor includes a first connection resistor end and a second connection resistor end, the first connection resistor end of the first connection resistor is connected to the processing circuit, the second connection resistor end of the first connection resistor is connected to the second end of the first switch module.

In one of the embodiments, the position detection circuit further includes a second switch module and a third ground resistor, the second switch module includes a third end, a fourth end and a second switch, the second switch module is configured to control the on-off state of the second switch according to whether the placement member is placed in the first placement position, the third end of the second switch module receives the system voltage, the fourth end of the first switch module is connected to the processing circuit and outputs a second state signal to the processing circuit according to the on-off state of the second switch to detect whether the placement member is correctly placed; the third ground resistor including a fifth ground resistor end and a sixth ground resistor end, the fifth ground resistor end of the third ground resistor is connected to the fourth end of the second switch module, the sixth ground resistor end of the third ground resistor is grounded.

The second state signal is to detect whether the placement member is placed in a preset position.

In one of the embodiments, the position detection circuit further includes a third switch module and a fifth ground resistor, the third switch module includes a fifth end, a sixth end and a third switch, the third switch module is configured to control the on-off state of the third switch according to whether the placement member is placed in the second placement position, the fifth end of the third switch module receives the system voltage, the sixth end of the third switch module is connected to the processing circuit and outputs a third state signal for detecting whether the placement member is correctly placed to the processing circuit according to the on-off state of the third switch; the fifth ground resistor including a seventh ground resistor end and an eighth ground resistor end, the seventh ground resistor end of the fifth ground resistor is connected to the sixth end of the third switch module, the eighth ground resistor end of the fifth ground resistor is grounded.

The third state signal is to detect whether the placement member is placed in a preset position.

In one of the embodiments, the position detection circuit further includes Hall detection circuit or infrared detection circuit.

The present invention provides an electronic cigarette, the electronic cigarette includes an electronic cigarette main body and a cartridge, the cartridge is detachably matched with the electronic cigarette main body, the electronic cigarette main body includes a processing circuit and a position detection circuit as described above, the placement member is the cartridge of the electronic cigarette, an aerosol-forming matrix is stored in the cartridge.

In one of the embodiments, the electronic cigarette main body further includes a heating member, when the processing circuit detects that the placement member is not correctly placed according to the position detection circuit, the processing circuit controls the heating member not to work.

In one of the embodiments, the electronic cigarette main body further includes a heating member, when the processing circuit receives the cigarette lighter signal, and the processing circuit detects that the placement member is correctly placed according to the position detection circuit, the processing circuit controls the operation of the heating member.

In one of the embodiments, the electronic cigarette main body further includes a heating member, when the processing circuit detects, according to the position detection circuit, that the placement member has changed from being placed correctly to being incorrectly placed, the processing circuit controls the heating member to clean the residue attached to the heating member.

The beneficial effects brought about by the technical solutions provided by the embodiments of the present disclosure are:

The present disclosure provides a position detection circuit and an electronic cigarette, which realizes automatic detection of whether the placement member, such as the cartridge of the electronic cigarette, is placed in the correct position, so as to remind the user whether the placement member has been placed in the corresponding position, thereby improving the user experience.

DETAILED DESCRIPTION OF PREFERRED EMBODIMENTS

In order to further explain the technical means and effects of the present disclosure to achieve the purpose of the predetermined disclosure, the following is combined with the drawings and preferred embodiments, the specific implementation of the position detection circuit and the electronic cigarette proposed according to the present disclosure the method, structure, characteristics and effects are described in detail later.

The aforementioned and other technical contents, features and effects of the present disclosure will be clearly presented in the following detailed description of the preferred embodiment with reference to the drawings. Through the description of the specific implementation manners, it is possible to have a more in-depth and specific understanding of the technical means and effects adopted by the present disclosure to achieve the predetermined purpose. However, the drawings shown are only for reference and explanation, and are not configured to limit the present disclosure.

A First Embodiment

Figure 1:
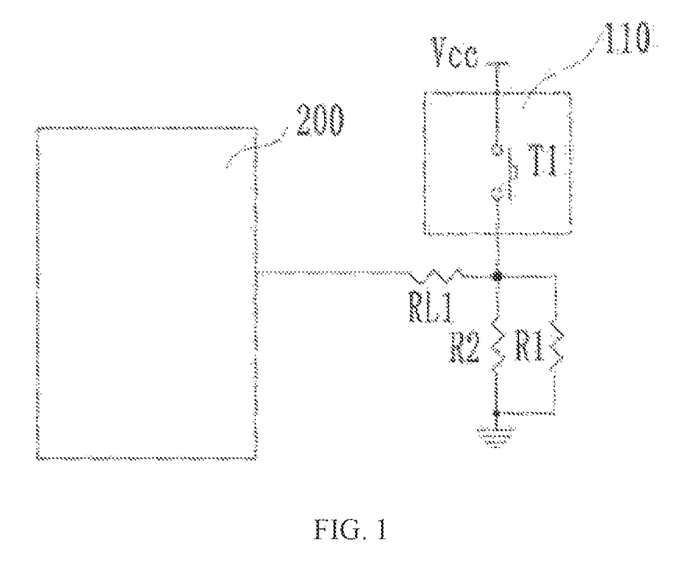
FIG. 1 is a circuit connection diagram of the position detection circuit of a first embodiment of the present disclosure.

FIG. 1 is a circuit connection diagram of the position detection circuit of the first embodiment of the present disclosure. As shown in FIG. 1, this embodiment provides a position detection circuit, the position detection circuit is connected to the processing circuit 200, the position detection circuit can be arranged on the cartridge. The placement member is the main part of the electronic cigarette, which is configured to detect whether the main part of the electronic cigarette and the cartridge are placed in an accurate position. The detection circuit can also be arranged in the electronic cigarette main body, the placement member is the cartridge or the cigarette holder part, which is configured to detect whether the cartridge or the cigarette holder part and the electronic cigarette main body are placed in an accurate position. The position detection circuit is a circuit for determining whether the placement member is accurately placed on the preset position. In one of the embodiments, the position detection circuit includes a first switch module 110 and a first ground resistor R1.

Wherein, the first switch module 110 includes a first end, a second end and a first switch T1, the first switch module 110 is configured to control the on-off state of the first switch T1 according to whether the placement member is placed in the first placement position, so that the first switch module 110 sends out a corresponding first state signal. The first end of the first switch module 110 receives the system voltage Vcc, the second end of the first switch module 110 outputs a first state signal to the processing circuit 200 according to the on-off state of the first switch T1; the first ground resistor end of the first ground resistor R1 is connected to the second end of the first switch module 110, and the second ground resistor end of the first ground resistor R1 is grounded.

In one of the embodiments, the placement member is placed in the first placement position and the first switch T1 is triggered to turn on accordingly, and when the placement member leaves the first placement position, the first switch T1 is turned off. In another embodiment, when the placement member is placed in the first placing position, the first switch T1 is triggered to open, and when the placement member leaves the first placing position, the first switch T1 is closed.

Specifically, the first switch module 110 may control the on-off state of the first switch T1 according to whether the placement member is placed in the first placement position. The first end of the first switch module 110 receives the system voltage Vcc. The first ground resistor end of the first ground resistor R1 is connected to the second end of the first switch module 110, the second ground resistor end of the first ground resistor R1 is grounded, so according to the on-off state of the first switch T1, it can be determined whether the power supply that provides the system voltage Vcc, the first switch module 110, and the first ground resistor R1 form a circuit loop. Therefore, when the on-off state of the first switch T1 is the on state, the power supply that provides the system voltage Vcc, the first switch module 110, and the first ground resistor R1 form a circuit loop; then the second end of the first switch module 110 outputs a corresponding current to the first ground resistor R1; and then the first ground resistor R1 flows into the ground end, the first ground resistor end of the first ground resistor R1 can have a corresponding voltage, and the second end of the first switch module 110 connected to the first ground resistor end of the first ground resistor R1 is High level; the first state signal, such as a high-level signal, can be output to the processing circuit 200 accordingly. Or, when the on-off state of the first switch T1 is the off state, the power supply that provides the system voltage Vcc, the first switch module 110, and the first ground resistor R1 cannot form a circuit loop; therefore, the second end of the first switch module 110 cannot output a corresponding current to the first ground resistor R1. The first ground resistor R1 can ensure that the voltage on the second end of the first switch module 110 is at a low level, and a second state signal, such as a low level signal, can be output to the processing circuit 200 accordingly; therefore, the processing circuit 200 can determine the on-off state of the first switch T1 according to the received first state signal or the second state signal, and then determine whether the placement member is placed in the first placing position. It is convenient to remind the user whether the placement member is placed in the corresponding position, and then whether the cigarette lighter operation can be performed, thereby improving the user experience.

Wherein, in the above-mentioned specific implementation manner, in an embodiment, the first switch module 110 controls the on-off state of the first switch T1 to be the on-state according to the placement of the placement member in the first placement position. Specifically, if the placement member is placed in the first placement position, the first switch module 110 triggers the first switch T1 to be turned on, and the second end of the first switch module 110 outputs a first state signal, such as a high-level signal, to the processing circuit 200. If the placement member is not placed in the first placement position, the second end of the first switch module 110 outputs a second state signal, such as a low-level signal, to the processing circuit 200; alternatively, in another embodiment, the first switch module 110 controls the on-off state of the first switch T1 to be the off state according to the placement of the placement member in the first placement position. Specifically, if the placement member is placed in the first placement position, the first switch module 110 triggers the first switch T1 to turn off, and the second end of the first switch module 110 outputs a second state signal, such as a low-level signal, to the processing circuit 200. If the placement member is not placed in the first placement position, the second end of the first switch module 110 outputs a first state signal, such as a high-level signal, to the processing circuit 200.

In one of the embodiments, the first switch end of the first switch T1 can act as the first end of the first switch module 110; the second switch end of the first switch T1 can act as the second end of the first switch module 110.

In one of the embodiments, the position detection circuit may further include a second ground resistor R2, the third ground resistor end of the second ground resistor R2 is connected to the first ground resistor end of the first ground resistor R1, the fourth ground resistor end of the second ground resistor R2 is connected to the second ground resistor end of the first ground resistor R1 to ensure that the second end of the first switch module 110 is at a low level when the first switch T1 is in the off state.

In one of the embodiments, a first connection resistor RL1 can be further provided between the second end of the first switch module 110 and the processing circuit 200, the first connection resistor end of the first connection resistor RL1 is connected to the processing circuit 200, the second connection resistor end of the first connection resistor RL1 is connected to the second end of the first switch module 110.

The position detection circuit provided by the embodiment of the present disclosure realizes the automatic detection of whether the placement member is placed in the correct position, so as to remind the user whether the placement member has been placed in the corresponding position, thereby improving the user experience. Or, when it is detected that the placement member is at the target placement position, the corresponding operation can be automatically turned on, which can simplify the manual operation of the user. Or, when it is detected that the placement member is at the target placement position, the corresponding operation is unlocked, thereby preventing user misoperation.

A Second Embodiment

Figure 2:
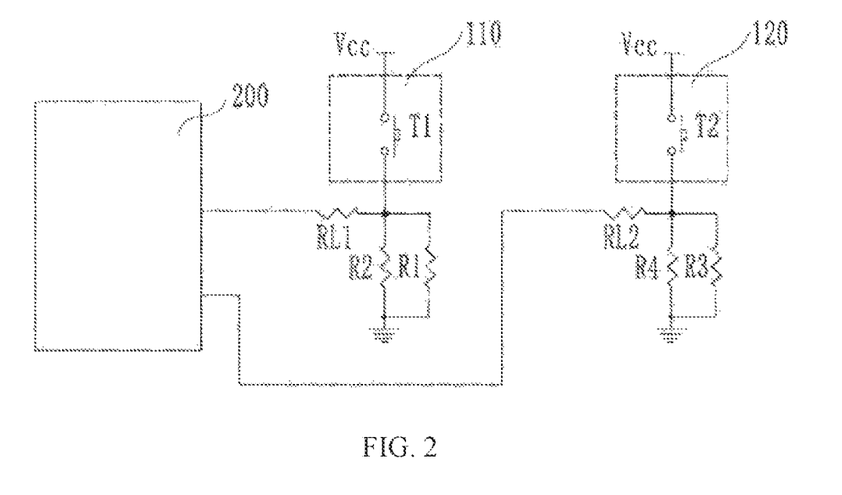
FIG. 2 is a circuit connection diagram of the position detection circuit of a second embodiment of the present disclosure.

FIG. 2 is a circuit connection diagram of the position detection circuit of the second embodiment of the present disclosure. The circuit connection of the position detection circuit shown in FIG. 2 is basically the same as that of the position detection circuit shown in FIG. 1, except that the position detection circuit of the second embodiment further includes a second switch module 120 and a third ground resistor R3.

Wherein, the second switch module 120 includes a third end, a fourth end and a second switch T2, the second switch module 120 is configured to control the on-off state of the second switch T2 according to whether the placement member is placed in the first placement position. The third end of the second switch module 120 receives the system voltage Vcc, the fourth end of the second switch module 120 outputs a third state signal or a fourth state signal to the processing circuit 200 according to the on-off state of the second switch T2. The fifth ground resistor end of the third ground resistor R3 is connected to the fourth end of the second switch module 120, and the sixth ground resistor end of the third ground resistor R3 is grounded.

Specifically, when the placement member is placed in the first placement position, the first switch T1 in the first switch module 110 and the second switch T2 in the second switch module 120 can be triggered and be in a corresponding on-off state. In one embodiment, all are in the on state, in another embodiment, all are in the off state. It is understood that, in other embodiments, one can be in the on state, and the other can be in the off state. In the following description, the first switch T1 of the first switch module 110 and the second switch T2 of the second switch module 120 are triggered and both are in a conducting state as an example for description.

When the placement member is placed in the first placement position, the first switch module 110 controls the first switch T1 to be in the on state and the second switch module 120 controls the second switch T2 to be in the on state. The power supply that provides the system voltage Vcc, the first switch module 110, and the first ground resistor R1 form a circuit loop, then the second end of the first switch module 110 outputs a corresponding current to the first ground resistor R1, it flows into the grounding end through the first ground resistor R1; the first ground resistor end of the first ground resistor R1 can have a corresponding voltage; the second end of the first switch module 110 connected to the first ground resistor end of the first ground resistor R1 is at a high level, and the first state signal, such as a high-level signal, can be correspondingly output to the processing circuit 200. Similarly, the power supply that provides the system voltage Vcc, the second switch module 120, and the third ground resistor R3 form a circuit loop, and the fourth end of the second switch module 120 outputs a corresponding current to the third ground resistor R3. Then the third ground resistor R3 flows into the ground end, the fifth ground resistor end of the third ground resistor R3 can have a corresponding voltage, and the fourth end of the second switch module 120 connected to the fifth ground resistor end of the third ground resistor R3 is High level, a third state signal such as a high level signal can be output to the processing circuit 200 accordingly. Therefore, the processing circuit 200 can determine that the first switch T1 and the second switch T2 are both in the on state according to the simultaneous reception of the first state signal and the third state signal; it is determined that the placing piece has been correctly placed in the first placing position, which is convenient for reminding the user that the placing piece has been placed at the corresponding position, thereby improving the user experience.

When the placement member is not correctly placed in the first placement position, the first switch module 110 controls the first switch T1 to be in the off state and/or the second switch module 120 controls the second switch T2 to be in the off state. The power supply that provides the system voltage Vcc, the first switch module 110, and the first ground resistor R1 cannot form a circuit loop; therefore, the second end of the first switch module 110 cannot output a corresponding current to the first ground resistor R1, the first ground resistor R1 can ensure that the voltage on the second end of the first switch module 110 is at a low level, and can correspondingly output a second state signal, such as a low-level signal, to the processing circuit 200. Similarly, the power supply that provides the system voltage Vcc, the second switch module 120, and the third ground resistor R3 cannot form a circuit loop. The fourth end of the second switch module 120 cannot output a corresponding current to the third ground resistor R3; then, the third ground resistor R3 can ensure that the voltage on the fourth end of the second switch module 120 is at a low level, and a fourth state signal such as a low level signal can be output to the processing circuit 200 accordingly. Therefore, the processing circuit 200 can determine that the first switch T1 and/or the second switch T2 is in the off state according to the second state signal and/or the fourth state signal received. Furthermore, it is determined that the placement member is not correctly placed in the first placement position, which is convenient for reminding the user that the placement member is not placed at the corresponding position, thereby improving the user experience.

Compared with the first embodiment, the second switch module 120 and the third ground resistor R3 are added to the position detection circuit of the second embodiment, so that the position detection circuit of the second embodiment is more reliable for the position detection of the placement member. It is understood that, in other implementations not shown, more than two switch modules can be provided, and a ground resistor corresponding to the number of switch modules can be provided to further ensure the reliability of detection.

In one of the embodiments, the third switch end of the second switch T2 can be act as the third end of the second switch module 120, the fourth switch end of the second switch T2 can be act as the fourth end of the second switch module 120.

In one of the embodiments, the position detection circuit may further include a fourth ground resistor R4. The ninth ground resistor end of the fourth ground resistor R4 is connected to the fifth ground resistor end of the third ground resistor R3, the tenth ground resistor end of the fourth ground resistor R4 is connected to the sixth ground resistor end of the third ground resistor R3 to ensure that the fourth end of the second switch module 120 is at a low level when the second switch T2 is in the off state.

In one of the embodiments, a second connection resistor RL2 can be further provided between the fourth end of the second switch module 120 and the processing circuit 200. The third connection resistor end of the second connection resistor RL2 is connected to the processing circuit 200. The fourth connection resistor end of the second connection resistor RL2 is connected to the fourth end of the second switch module 120.

The position detection circuit provided by the embodiment of the present disclosure realizes the automatic detection of whether the placement member is placed in the correct position, so as to remind the user whether the placement member has been placed in the corresponding position, thereby improving the user experience. Or, when it is detected that the placement member is at the target placement position, the corresponding operation can be automatically turned on, which can simplify the manual operation of the user. Or, when it is detected that the placement member is at the target placement position, the corresponding operation is unlocked, thereby preventing user misoperation.

A Third Embodiment

Figure 3:
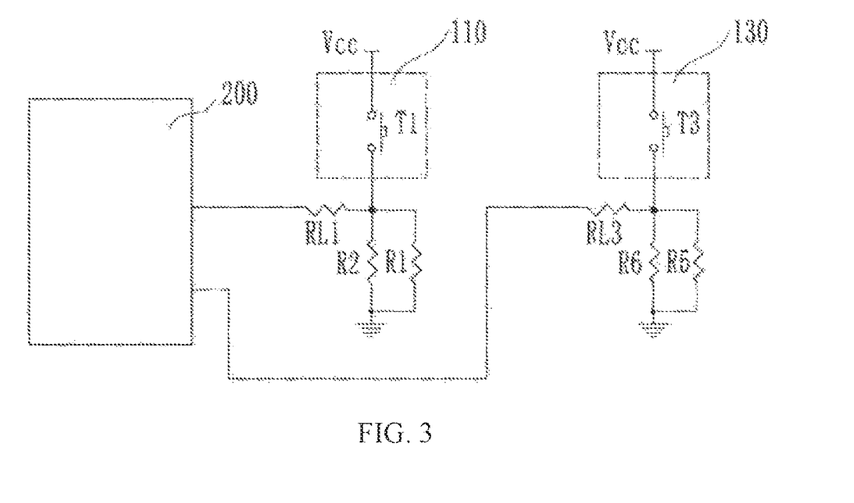
FIG. 3 is a circuit connection diagram of the position detection circuit of a third embodiment of the present disclosure.

FIG. 3 is a circuit connection diagram of the position detection circuit of the third embodiment of the present disclosure. The circuit connection of the position detection circuit shown in FIG. 3 is basically the same as that of the position detection circuit shown in FIG. 1, except that the position detection circuit of the third embodiment further includes a third switch module 130 and a fifth ground resistor R5.

Specifically, the third switch module 130 includes a fifth end, a sixth end and a third switch T3, the third switch module 130 is configured to control the on-off state of the third switch T3 according to whether the placement member is placed in the second placement position, the fifth end of the third switch module 130 receives the system voltage Vcc, the sixth end of the third switch module 130 outputs a fifth state signal or a sixth state signal to the processing circuit 200 according to the on-off state of the third switch T3. The seventh ground resistor end of the fifth ground resistor R5 is connected to the sixth end of the third switch module 130, and the eighth ground resistor end of the fifth ground resistor R5 is grounded.

Specifically, the position detection circuit of this embodiment detects whether the placement member is at the first placing position and the second placing position at the same time. That is, the first part of the placing piece is placed at the first placing position and the second part of the placing piece is placed at the second placing position. When the placement member is placed in the first placement position and the second placement position at the same time, the first switch T1 in the first switch module 110 and the third switch T3 in the third switch module 130 can be triggered and be in a corresponding on-off state. In one embodiment, all are in the on state, in another embodiment, all are in the off state. It can be understood that in other embodiments, one can be in the on state and the other in the off state. In the following description, the first switch T1 of the first switch module 110 and the third switch T3 of the third switch module 130 are triggered and both are in a conducting state as an example for description.

When the first part of the placing member is placed in the first placement position, the first switch module 110 controls the first switch T1 to be in the on state; the power supply that provides the system voltage Vcc, the first switch module 110, and the first ground resistor R1 form a circuit loop; the second end of the first switch module 110 outputs a corresponding current to the first ground resistor R1; then it flows into the grounding end through the first ground resistor R1, the first ground resistor end of the first ground resistor R1 may have a corresponding voltage. Then the second end of the first switch module 110 connected to the first ground resistor end of the first ground resistor R1 is at a high level, and the first state signal, such as a high-level signal, can be correspondingly output to the processing circuit 200. Similarly, when the second part of the placement member is placed in the second placement position, the third switch module 130 controls the third switch T3 to be in the on state; the power supply that provides the system voltage Vcc, the third switch module 130, and the fifth ground resistor R5 form a circuit loop; the sixth end of the third switch module 130 outputs a corresponding current to the fifth ground resistor R5; then it flows into the grounding end through the fifth ground resistor R5, the seventh ground resistor end of the fifth ground resistor R5 may have a corresponding voltage. Then, the sixth end of the third switch module 130 connected to the seventh ground resistor end of the fifth ground resistor R5 is at a high level, and a fifth state signal, such as a high-level signal, can be output to the processing circuit 200 accordingly. Therefore, the processing circuit 200 can determine that the first switch T1 and the third switch T3 are both in the on state according to the simultaneous reception of the first state signal and the fifth state signal.

When the first part of the placing member is not placed in the first placement position, the first switch module 110 controls the first switch T1 to be in an off state; the power supply that provides the system voltage Vcc, the first switch module 110, and the first ground resistor R1 cannot form a circuit loop; the second end of the first switch module 110 cannot output a corresponding current to the first ground resistor R1; then, the first ground resistor R1 can ensure that the voltage on the second end of the first switch module 110 is at a low level, and the second state signal, such as a low level signal, can be output to the processing circuit 200 accordingly. Similarly, when the second part of the placement member is not placed in the second placement position, the third switch module 130 controls the third switch T3 to be in the off state; the power supply that provides the system voltage Vcc, the third switch module 130, and the fifth ground resistor R5 cannot form a circuit loop; the sixth end of the third switch module 130 cannot output a corresponding current to the fifth ground resistor R5; the fifth ground resistor R5 can ensure that the voltage on the sixth end of the third switch module 130 is at a low level, and a sixth state signal such as a low level signal can be output to the processing circuit 200 accordingly. Therefore, the processing circuit 200 can determine that the first switch T1 and/or the third switch T3 is in the off state according to the second state signal and/or the sixth state signal received; then it is determined that the placement member is not correctly placed in the first placement position and/or the second placement position. It is convenient to remind the user that the placement member is not placed in the corresponding position, thereby improving the user experience.

In one of the embodiments, the fifth switch end of the third switch T3 can be act as the fifth end of the third switch module 130, the sixth switch end of the third switch T3 can be act as the sixth end of the third switch module 130.

In one of the embodiments, the position detection circuit may further include a sixth ground resistor R6, the eleventh ground resistor end of the sixth ground resistor R6 is connected to the seventh ground resistor end of the fifth ground resistor R5, the twelfth ground resistor end of the sixth ground resistor R6 is connected to the seventh ground resistor end of the fifth ground resistor R5 to ensure that the sixth end of the third switch module 130 is at a low level when the third switch T3 is in the off state.

In one of the embodiments, a third connection resistor RL3 can be further provided between the sixth end of the third switch module 130 and the processing circuit 200, the fifth connection resistor end of the third connection resistor RL3 is connected to the processing circuit 200, the sixth connection resistor end of the third connection resistor RL3 is connected to the sixth end of the third switch module 130.

It is understood that, in other embodiments not shown, the placement member may also be divided into two or more parts, and the placement positions correspond to each part of the placement member in a one-to-one manner.

The position detection circuit provided by the embodiment of the disclosure realizes the automatic detection of whether the placement member is placed in the correct position, so as to remind the user whether the placement member has been placed in the corresponding position, thereby improving the user experience. Or, when it is detected that the placement member is at the target placement position, the corresponding operation can be automatically turned on, which can simplify the manual operation of the user. Or, when it is detected that the placement member is at the target placement position, the corresponding operation is unlocked, thereby preventing user misoperation.

A Fourth Embodiment

This embodiment provides an electronic cigarette. The electronic cigarette includes an electronic cigarette main body and a cartridge. The cartridge is detachably matched with the electronic cigarette main body, wherein, the electronic cigarette main body includes the processing circuit 200 and the position detection circuit of any of the above embodiments. The placement member is the cartridge of the electronic cigarette. For the specific implementation of the position detection circuit of the electronic cigarette, reference can be made to the corresponding drawings and the corresponding description of the position detection circuit in any of the foregoing embodiments, and details are not described herein again. When corresponding to the first embodiment or the second embodiment, a first placement position is provided on the electronic cigarette main body. When corresponding to the third embodiment, a first placement position and a second placement position are provided on the electronic cigarette main body.

In one of the embodiments, the electronic cigarette main body may include a heating member, when the processing circuit 200 detects that the placement member is not placed correctly according to the position detection circuit, the processing circuit 200 controls the heating member not to work, so as to ensure the safe use of the electronic cigarette. An aerosol-forming matrix is stored in the cartridge, for example, smoke liquid, smoke paste, or cut tobacco. Assuming that the cartridge is not placed correctly, the electronic cigarette main body and the cartridge are not properly matched, and the cartridge cannot supply the aerosol-forming matrix to the heating member. In this case, if the heating member can still work, it will cause a waste of energy. In addition, the heating member generates high temperature during operation, and the heating member is exposed without being shielded by the cartridge, and there is a possibility that the user may get burned by touching the heating member. When the processing circuit 200 detects that the placement member is correctly placed according to the position detection circuit, the processing circuit 200 controls the heating member to work. For the first embodiment or the second embodiment, the correct placement of the placement member means that the placement member is correctly placed in the first placement position. For the third embodiment, the correct placement of the placement member means that the placement member is correctly placed in the first placement position and the second placement position.

In one of the embodiments, the electronic cigarette main body may include a heating member, when the processing circuit 200 does not receive the cigarette lighter signal, or the processing circuit 200 detects that the placement member is not placed correctly according to the position detection circuit, the processing circuit 200 controls the heating member not to work. Only when the cartridge is correctly placed in the placement position and the processing circuit 200 receives the cigarette lighter signal, the processing circuit 200 controls the heating member to work. Thus, when the cartridge is not correctly placed in the placement position, even if the processing circuit 200 receives the cigarette lighter signal, it still controls the heating member not to work, so as to ensure the safe use of the electronic cigarette. When the cartridge is correctly placed in the placement position, the cigarette lighter signal needs to be received to control the heating member to work. Compared with the previous embodiment, it can not only ensure the safe use of the electronic cigarette, but also enable the user to control the working time of the heating member by himself.

In one of the embodiments, the electronic cigarette main body may include a heating member. When the processing circuit 200 detects that the placement member is changed from being placed correctly to not place correctly according to the position detection circuit, the processing circuit 200 controls the work of the heating member to clean the residue attached to the heating member. For example, aerosol-forming matrix, carbides produced at high temperatures, and so on. When the placement member changes from being placed correctly to being incorrectly placed, that is, when the cartridge leaves the working position, the e-cigarette can turn on the self-cleaning function. The processing circuit 200 controls the operation of the heating member to clean the residue attached to the heating member. In the above two embodiments, the work of the heating member refers to the atomization work of the heating member. In this embodiment, the work of the heating member refers to the cleaning work of the heating member, and the power of the heating member during the cleaning work is greater than the power of the heating member during the atomization work. When the cartridge leaves the working position, the electronic cigarette automatically turns on the cleaning function, eliminating the need for manual operation by the user, and has a good user experience. In addition, it can prevent the heating member from generating high temperature when working at a higher power and damaging the parts in the cartridge.

The electronic cigarette provided in this embodiment realizes the automatic detection of the placement member, for example, whether the pod of the electronic cigarette is placed in the correct position, so as to remind the user whether the placement member has been placed in the corresponding position, thereby improving the user experience and the safety of the electronic cigarette.

The above-mentioned embodiments merely represent several implementations of the present application, and the descriptions thereof are more specific and detailed, but they shall not be understood as a limitation on the scope of the present application. It should be noted that, for those of ordinary skill in the art, variations and improvements may still be made without departing from the concept of the present application, and all of which shall fall into the protection scope of the present application. Therefore, the scope of protection of the present application shall be subject to the appended claims.

What is claimed is:

1. A position detection circuit having a first switch module outputting a first state signal, which is connected to the processing circuit (200) for detecting whether a placement member is correctly placed, wherein the position detection circuit comprises:
   the first switch module (110), comprising a first end, a second end and a first switch (T1), the first switch module (110) configured to control on-off state of the first switch (T1) according to whether the placement member is placed in a first placement position, the first end of the first switch module (110) receiving system voltage (Vcc), the second end of the first switch module (110) connected to the processing circuit (200) and outputting the first state signal to the processing circuit (200) according to the on-off state of the first switch (T1); and
   a first ground resistor (R1) comprising a first ground resistor end and a second ground resistor end, the first ground resistor end of the first ground resistor (R1) connected to the second end of the first switch module (110), and the second ground resistor end of the first ground resistor (R1) grounded.

2. The position detection circuit according to claim 1, wherein the first switch (T1) comprises a first switch end and a second switch end; and
   the first switch end of the first switch (T1) acts as the first end of the first switch module (110); the second switch end of the first switch (T1) acts as the second end of the first switch module (110).

3. The position detection circuit according to claim 1, wherein the position detection circuit also comprises a second ground resistor (R2) which comprises a third around resistor end and a fourth ground resistor end, the third around resistor end of the second ground resistor (R2) is connected to the first ground resistor end of the first ground resistor (R1), the fourth ground resistor end of the second ground resistor (R2) is connected to the second ground resistor end of the first ground resistor (R1).

4. The position detection circuit according to claim 1, wherein a first connection resistor (RL1) is further provided between the second end of the first switch module (110) and the processing circuit (200), the first connection resistor (RL1) comprises a first connection resistor end and a second connection resistor end, the first connection resistor end of the first connection resistor (RL1) is connected to the processing circuit (200), and the second connection resistor end of the first connection resistor (RL1) is connected to the second end of the first switch module (110).

5. The position detection circuit according to claim 1, wherein the position detection circuit further comprises:
   a second switch module (120), the second switch module (120) comprising a third end, a fourth end and a second switch (T2), the second switch nodule (120) configured to control on-off state of the second switch (T2) according to whether the placement member is placed in the first placement position, the third end of the second switch module (120) receiving the system voltage (Vcc), the fourth end of the second switch module (120) connected to the processing circuit (200) and outputting a third state signal or a fourth state signal to the processing circuit (200) according to the on-off state of the second switch (12); and
   a third ground resistor (R3) comprising a fifth ground resistor end and a sixth ground resistor end, the fifth ground resistor end of the third ground resistor (R3) connected to the fourth end of the second switch module (120), the sixth ground resistor end of the third ground resistor (R3) grounded.

6. The position detection circuit according to claim 1, wherein the position detection circuit further comprises:
   a third switch module (130), the third switch module (130) comprising a fifth end, a sixth end and a third switch (T3), the third switch module (130) configured to control on-off state of the third switch (T3) according to whether the placement member is placed in a second placement position, the fifth end of the third switch module (130) receiving the system voltage (Vcc), the sixth end of the third switch module (130) connected to the processing circuit (200) and outputting a fifth state signal or a sixth state signal to the processing circuit (200) according to the on-off state of the third switch (T3); and a fifth ground resistor (R5) comprising a seventh around resistor end and an eighth ground resistor end, the seventh ground resistor end of the fifth ground resistor (R5) connected to the sixth end of the third switch module (130), the eighth ground resistor end of the fifth ground resistor (R5) is grounded.

7. An electronic cigarette having a first switch module outputting a first state signal, wherein, the electronic cigarette comprises an electronic cigarette main body and a cartridge, the cartridge detachably is matched with the electronic cigarette main body, the electronic cigarette main body comprises a processing circuit (200) and the position detection circuit according to claim 1, the placement member is the cartridge of the electronic cigarette, the cartridge stores an aerosol-forming matrix.

8. The electronic cigarette according to claim 7, wherein the electronic cigarette main body further comprises a heating member, when the processing circuit (200) detects that the placement member is not placed correctly according to the position detection circuit, the processing circuit (200) controls the heating member not to work.

9. The electronic cigarette according to claim 7, wherein the electronic cigarette main body further comprises a heating member, when the processing circuit (200) receives the cigarette lighter signal, and the processing circuit (200) detects that the placement member is correctly placed according to the position detection circuit, the processing circuit (200) controls the heating member to work.

10. The electronic cigarette according to claim 7, wherein the electronic cigarette main body further comprises a heating member, when the processing circuit (200) detects that the placement member changes from being placed correctly to being incorrectly placed according to the position detection circuit, the processing circuit (200) controls the heating member to clean residue attached to the heating member.

11. A position detection circuit having a first switch module outputting a first state signal wherein the position detection circuit is connected to a processing circuit (200) for detecting whether a placement member is laced in a reset position, wherein the position detection circuit comprises:

the first switch module (110), the first switch module (110) comprising a first end, a second end and a first switch (T1), the first switch module (110) configured to control on-off state of the first switch (T1) according to whether the placement member is placed in the first placement position, the first end of the first switch module (110) receiving system voltage (Vcc), the second end of the first switch module (110) connected to the processing circuit (200) and outputting the first state signal to the processing circuit (200) according to the on-off state of the first switch (T1);

the first state signal being to detect whether the placement member is placed in a preset position, and a first ground resistor (R1) comprising a first ground resistor end and a second ground resistor end, the first ground resistor end of the first ground resistor (R1) connected to the second end of the first switch module (110), the second ground resistor end of the first ground resistor (R1) is grounded.

12. The position detection circuit according to claim 11, wherein the first switch (T1) comprises a first switch end and a second switch end, the first switch end of the first switch (T1) acts as the first end of the first switch module (110); the second switch end of the first switch (T1) acts as the second end of the first switch module (110).

13. The position detection circuit according to claim 11, wherein the position detection circuit also comprises a second ground resistor (R2) which comprises a third ground resistor end and a fourth ground resistor end, the third ground resistor end of the second around resistor (R2) is connected to the first ground resistor end of the first ground resistor (R1), the fourth ground resistor end of the second ground resistor (R2) is connected to the second ground resistor end of the first ground resistor (R1).

14. The position detection circuit according to claim 11, wherein a first connection resistor (RL1) is further provided between the second end of the first switch module (110) and the processing circuit (200), the first connection resistor (RL1) comprises a first connection resistor end and a second connection resistor end, the first connection resistor end of the first connection resistor (RL1) is connected to the processing circuit (200), the second connection resistor end of the first connection resistor (RL1) is connected to the second end of the first switch module (110).

15. The position detection circuit according to claim 11, wherein the position detection circuit further comprises:
a second switch module (120), the second switch module (120) comprising a third end, a fourth end and a second switch (T2), the second switch module (120) is configured to control on-off state of the second switch (T2) according to whether the placement member is placed in the first placement position, the third end of the second switch module (120) receiving the system voltage (Vcc), the fourth end of the second switch module (120) connected to the processing circuit (200) and outputting a second state signal to the processing circuit (200) according to the on-off state of the second switch (T2) to detect whether the placement member is correctly placed; the second state signal is to detecting whether the placement member is placed in a preset position; and a third ground resistor (R3) comprising a fifth ground resistor end and a sixth ground resistor end, the fifth ground resistor end of the third ground resistor (R3) connected to the second end of the second switch module (120), the sixth ground resistor end of the third ground resistor (R3) grounded.

16. The position detection circuit according to claim 11, wherein the position detection circuit further comprises:
a third switch module (130), the third switch module (130) comprising a fifth end, a sixth end and a third switch (T3), the third switch module (130) used to control the on-off state of the third switch (13) according to whether the placement member is placed in the second placement position, the fifth end of the third switch module (130) receiving the system voltage (Vcc), the sixth end of the third switch module (130) connected to the processing circuit (200) and outputting a third state signal the processing circuit (200) according to the on-off state of the third switch (T3) to detect whether the placement member is correctly placed; the third state signal being to detect whether the placement member is placed in a preset position;

a fifth ground resistor (R5) comprising a seventh around resistor end and an eighth ground resistor end, the seventh ground resistor end of the fifth ground resistor (R5) connected to the sixth end of the third switch module (130), the eighth ground resistor end of the fifth ground resistor (R5) grounded.

17. The position detection circuit according to claim 11, wherein the position detection circuit comprises: Hall detection circuit or infrared detection circuit.

18. The position detection circuit according to claim 11, wherein the position detection circuit is set at an electronic cigarette, the electronic cigarette comprises an electronic cigarette main body and a cartridge, the cartridge is detachably matched with the electronic cigarette main body, the electronic cigarette main body comprises a processing circuit (200) and the position detection circuit, the placement member is the cartridge of the electronic cigarette, the cartridge stores an aerosol-forming matrix.

19. The position detection circuit according to claim 18, wherein the electronic cigarette main body further comprises a heating member, when the processing circuit (200) detects that the placement member is not placed correctly according to the position detection circuit, the processing circuit (200) controls the heating member not to work.

\* \* \* \* \*